United States Patent
Shill et al.

(10) Patent No.: US 11,409,318 B2
(45) Date of Patent: Aug. 9, 2022

(54) CURRENT MIRROR CIRCUIT

(71) Applicant: TEXAS INSTRUMENTS INCORPORATED, Dallas, TX (US)

(72) Inventors: Mark Allan Shill, Tucson, AZ (US); Binan Wang, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/347,951

(22) Filed: Jun. 15, 2021

(65) Prior Publication Data

US 2021/0311519 A1 Oct. 7, 2021

Related U.S. Application Data

(62) Division of application No. 16/722,011, filed on Dec. 20, 2019, now Pat. No. 11,068,010.

(51) Int. Cl.
*G05F 3/26* (2006.01)
*H03M 1/78* (2006.01)

(52) U.S. Cl.
CPC ............ *G05F 3/262* (2013.01); *H03M 1/785* (2013.01)

(58) Field of Classification Search
CPC .............................. G05F 3/262; H03M 1/785
USPC .......................................................... 327/543
See application file for complete search history.

(56) References Cited

U.S. PATENT DOCUMENTS

| | | | |
|---|---|---|---|
| 6,329,837 B1 | 12/2001 | Whitworth et al. | |
| 6,897,717 B1 | 5/2005 | Eddleman et al. | |
| 2007/0210855 A1 | 9/2007 | Raimar | |
| 2008/0150650 A1* | 6/2008 | Rentala | H04N 5/148 333/32 |
| 2019/0222203 A1 | 7/2019 | Tripoli et al. | |

\* cited by examiner

*Primary Examiner* — Tomi Skibinski
(74) *Attorney, Agent, or Firm* — John R. Pessetto; Charles A. Brill; Frank D. Cimino

(57) ABSTRACT

A current mirror circuit includes a current output terminal, a first transistor, a second transistor, and a digital-to-analog converter (DAC). The first transistor includes a first terminal coupled to a power rail, a second terminal coupled to a current source, and a third terminal coupled to the current source. The second transistor includes a first terminal coupled to the power rail, a second terminal coupled to the second terminal of the first transistor, and a third terminal coupled to the current output terminal. The DAC includes an output terminal coupled to the second transistor.

16 Claims, 4 Drawing Sheets

US 11,409,318 B2

CURRENT MIRROR CIRCUIT

CROSS-REFERENCE TO RELATED APPLICATION(S)

This divisional application claims priority to U.S. patent application Ser. No. 16/722,011, filed Dec. 20, 2019, which application is incorporated herein by reference in its entirety.

BACKGROUND

Current sources are typically used in integrated circuits to set the DC operating point (or biasing condition) of the circuit. Current mirrors are used in analog circuits to generate an output current proportional to, or a replica of, an input current provided by a current source. The proportionality constant of the output and input current in current mirrors is commonly known as mirroring ratio. A simple current mirror circuit can be implemented using two metal oxide semiconductor (MOS) transistors.

SUMMARY

Current mirror circuits with multiple digital-to-analog converter (DAC) trimmed outputs are disclosed herein. In one example, a current mirror circuit includes a current output terminal, a first transistor, a second transistor, and a DAC. The first transistor includes a first terminal coupled to a power rail, a second terminal coupled to a current source, and a third terminal coupled to the current source. The second transistor includes a first terminal coupled to the power rail, a second terminal coupled to the second terminal of the first transistor, and a third terminal coupled to the current output terminal. The DAC includes an output terminal coupled to the second transistor.

In another example, a current mirror circuit includes a current output terminal, a first transistor, a second transistor, and a DAC. The first transistor includes a source terminal coupled to a power rail, a gate terminal coupled to a current source, and a drain terminal coupled to the gate terminal. The second transistor includes a source terminal coupled to the power rail, a gate terminal coupled to the gate terminal of the first transistor, and a drain terminal coupled to the current output terminal. The DAC includes an output terminal coupled to the gate terminal of the second transistor.

In a further example, a current mirror circuit includes a current output terminal, a first transistor, a second transistor, and a DAC. The first transistor includes a source terminal coupled to a power rail, a gate terminal coupled to a current source, and a drain terminal coupled to the gate terminal. The second transistor includes a source terminal coupled to the power rail, a gate terminal coupled to the gate terminal of the first transistor, and a drain terminal coupled to the current output terminal. The DAC includes an output terminal coupled to the source terminal of the second transistor.

BRIEF DESCRIPTION OF THE DRAWINGS

For a detailed description of various examples, reference will now be made to the accompanying drawings in which.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

In some analog circuits that include a current mirror circuit providing multiple output currents, it is important for the multiple output currents to match with a predetermined degree of accuracy. For example, in a multi-channel digital-to-analog converter (DAC) circuit, each DAC channel includes a multi-output current mirror circuit. The different current outputs generated by the multi-output current mirror circuit at a given calibration temperature should match to within a predetermined accuracy (e.g., 0.05%).

Circuits apply various techniques to provide matched currents. These techniques generally less than ideal because of the increased circuit area needed for implementation. For example, some circuits include an individual and separately biased single current source with individual trim for each element of the current source. Other circuits include a current mirror that incorporates degeneration resistors and individual trimming of each current source leg degeneration resistor for matching. This approach however creates a non-linear trim transfer function and sometimes requires level shifting logic-level translators to control degeneration resistor trim. Yet other circuits add parallel, small scaled down current mirror elements to individual main current source legs for trim matching adjustment. Such implementations increase layout size and complexity, and sometimes require level shifting logic-level translators to control parallel trim adjust mirror elements.

Implementations of the multiple-output current mirror circuit disclosed herein include a DAC for each current output. The DACs allow each output current to be trimmed (increased or decreased) as needed to provide accurate matching of the output currents. The multiple-output current mirror circuits provide a linear trim transfer function that is implemented in relatively small circuit area.

Figure 1:
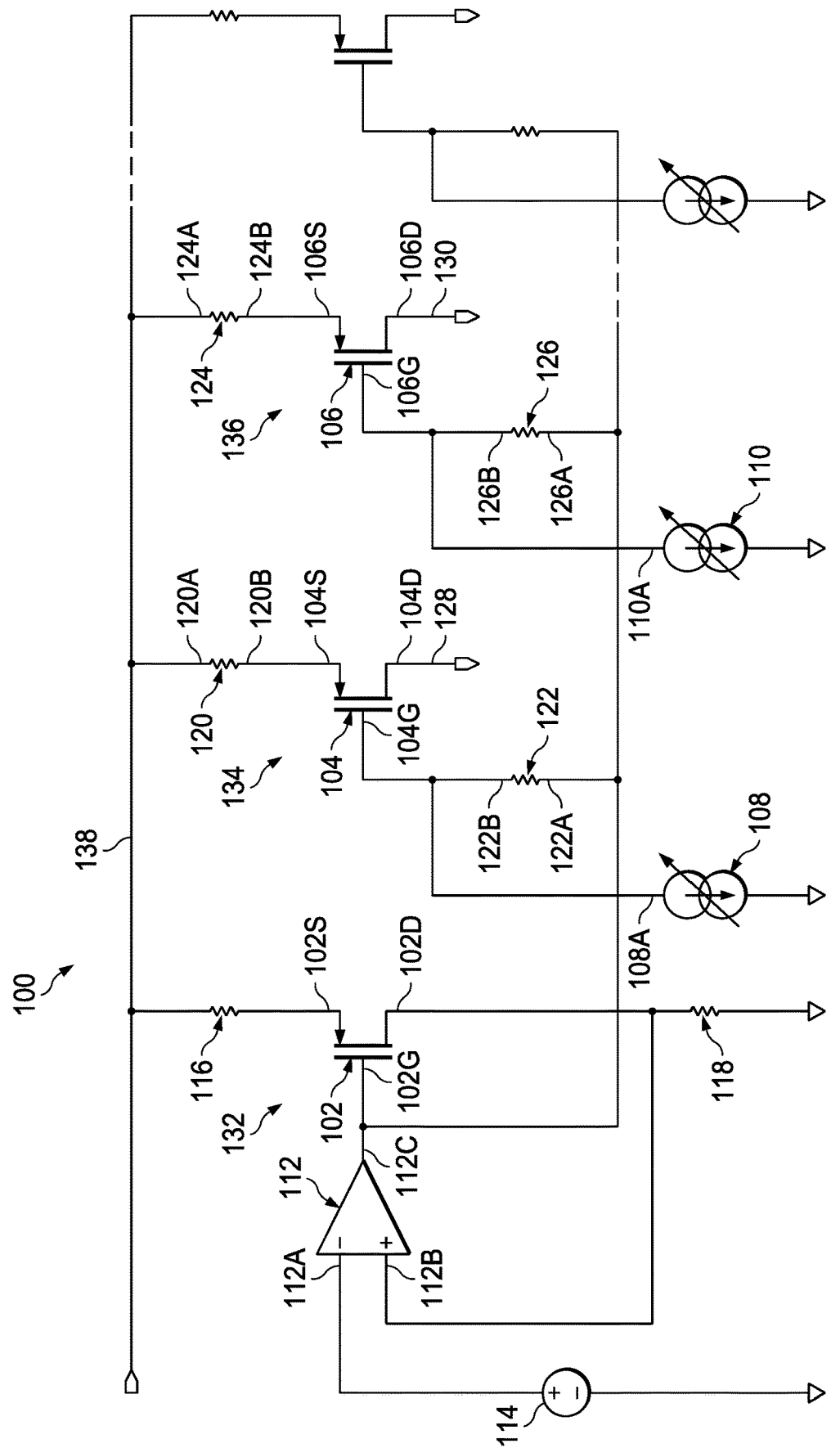
FIG. 1 shows a schematic diagram for a first current mirror circuit that includes a trim digital-to-analog converter (DAC) in accordance with this description.

FIG. 1 shows a schematic diagram for a current mirror circuit 100 that includes a trim DAC in accordance with this description. The current mirror circuit 100 includes a reference current circuit 132, a mirror circuit 134, and a mirror circuit 136. In practice, the current mirror circuit 100 includes one or more mirror circuits. The reference current circuit 132 includes a transistor 102, an amplifier 112, a voltage source 114, a resistor 116, and a resistor 118. A source terminal 102S of the transistor 102 is coupled to a power rail 138 via the resistor 116. A drain terminal 102D of the transistor 102 is coupled to the ground via the resistor 118, where the resistor 118 operates as a current source. The gate terminal 102G of the transistor 102 is coupled to the resistor 118 and the drain terminal 102D of the transistor 102 via the amplifier 112. The amplifier 112 sets the voltage at the gate terminal 102G of the transistor 102. The amplifier 112 includes an input terminal 112A coupled to a voltage source 114, an input terminal 112B coupled to the drain terminal 102D of the transistor 102, and an output terminal 112C coupled to the gate terminal 102G of the transistor 102.

The mirror circuit 134 includes a current output terminal 128, a transistor 104, a resistor 120, a resistor 122, and a DAC 108. The current output terminal 128 is coupled to a drain terminal 104D of the transistor 104 for providing an output current to circuitry external to the current mirror circuit 100. A source terminal 104S of the transistor 104 is coupled to the power rail 138 via the resistor 120. The resistor 120 includes a terminal 120A coupled to the power rail 138 and a terminal 120B coupled to the source terminal 104S of the transistor 104. A gate terminal 104G of the transistor 104 is coupled to the gate terminal 102G of the transistor 102 via the resistor 122. The resistor 122 includes a terminal 122A coupled to the gate terminal 102G of the transistor 102 and a terminal 122B coupled to the gate terminal 104G of the transistor 104.

The DAC 108 provides for trimming of the current provided at the current output terminal 128. The DAC 108 includes an output terminal 108A coupled to the gate terminal 104G of the transistor 104. The DAC 108 selectably sources or sinks current to adjust the voltage at the gate terminal 104G of the transistor 104. For example, while measuring the current provided at the current output terminal 128, a digital value provided to the DAC 108 is changed to adjust the voltage at the gate terminal 104G of the transistor 104 and set the current provided at the current output terminal 128 to a desired value.

The mirror circuit 136 includes a current output terminal 130, a transistor 106, a resistor 124, a resistor 126, and a DAC 110. The current output terminal 130 is coupled to a drain terminal 106D of the transistor 106 for providing an output current to circuitry external to the current mirror circuit 100. A source terminal 106S of the transistor 106 is coupled to the power rail 138 via the resistor 124. The resistor 124 includes a terminal 124A coupled to the power rail 138 and a terminal 124B coupled to the source terminal 106S of the transistor 106. A gate terminal 106G of the transistor 106 is coupled to the gate terminal 102G of the transistor 102 via the resistor 126. The resistor 126 includes a terminal 126A coupled to the gate terminal 102G of the transistor 102 and a terminal 126B coupled to the gate terminal 106G of the transistor 106.

The DAC 110 provides for trimming of the current provided at the current output terminal 130. The DAC 110 includes an output terminal 110A coupled to the gate terminal 106G of the transistor 106. The DAC 110 sources or sinks current to adjust the voltage at the gate terminal 106G of the transistor 106. For example, while measuring the current provided at the current output terminal 130, a digital value provided to the DAC 110 is changed to adjust the voltage at the gate terminal 106G of the transistor 106 and set the current provided at the current output terminal 130 to a desired value (e.g., set to match the current provided at the current output terminal 128). Thus, each mirror circuit of the current mirror circuit 100 includes a DAC that allows the current output to be adjusted to match the current output of each other mirror circuit.

Figure 2:
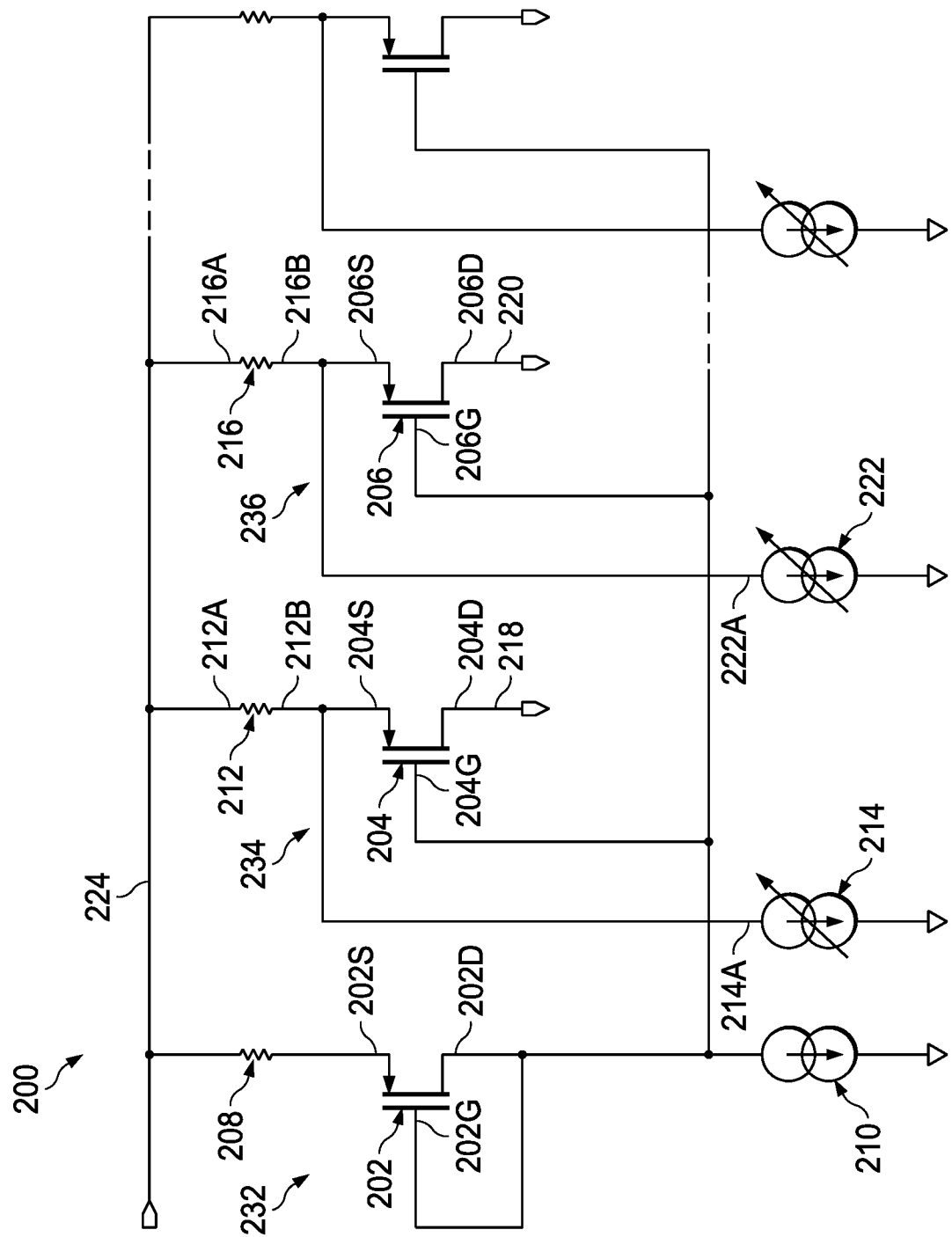
FIG. 2 shows a schematic diagram for a second current mirror circuit that includes a trim DAC in accordance with this description.

FIG. 2 shows a schematic diagram for a current mirror circuit 200 that includes a trim DAC in accordance with this description. The current mirror circuit 200 includes a reference current circuit 232, a mirror circuit 234, and a mirror circuit 236. In practice, the current mirror circuit 200 includes one or more mirror circuits. The reference current circuit 232 includes a transistor 202, a resistor 208, and a current source 210. A source terminal 202S of the transistor 202 is coupled to a power rail 224 via the resistor 208. A drain terminal 202D of the transistor 202 is coupled to the current source 210. The gate terminal 202G of the transistor 202 is coupled to the drain terminal 202D of the transistor 202.

The mirror circuit 234 includes a current output terminal 218, a transistor 204, a resistor 212, and a DAC 214. The current output terminal 218 is coupled to a drain terminal 204D of the transistor 204 for providing an output current to circuitry external to the current mirror circuit 200. A source terminal 204S of the transistor 204 is coupled to the power rail 224 via the resistor 212. The resistor 212 includes a terminal 212A coupled to the power rail 224 and a terminal 212B coupled to the source terminal 204S of the transistor 204. A gate terminal 204G of the transistor 204 is coupled to the gate terminal 202G of the transistor 202.

The DAC 214 provides for trimming of the current provided at the current output terminal 218. The DAC 214 includes an output terminal 214A coupled to the source terminal 204S of the transistor 204. The DAC 214 selectably sources or sinks current to adjust the current flowing into the source terminal 204S of the transistor 204. For example, while measuring the current provided at the current output terminal 218, a digital value provided to the DAC 214 is changed to adjust the current flowing into the source terminal 204S of the transistor 204 and set the current provided at the current output terminal 218 to a desired value.

The mirror circuit 236 includes a current output terminal 220, a transistor 206, a resistor 216, and a DAC 222. The current output terminal 220 is coupled to a drain terminal 206D of the transistor 206 for providing an output current to circuitry external to the current mirror circuit 200. A source terminal 206S of the transistor 206 is coupled to the power rail 224 via the resistor 216. The resistor 216 includes a terminal 216A coupled to the power rail 224 and a terminal 216B coupled to the source terminal 206S of the transistor 206. A gate terminal 206G of the transistor 206 is coupled to the gate terminal 202G of the transistor 202.

The DAC 222 provides for trimming of the current provided at the current output terminal 220. The DAC 222 includes an output terminal 222A coupled to the source terminal 206S of the transistor 206. The DAC 222 sources or sinks current to adjust the current flowing into the source terminal 206S of the transistor 206. For example, while measuring the current provided at the DAC 222, a digital value provided to the DAC 222 is changed to adjust the current flowing into the source terminal 206S of the transistor 206 and set the current provided at the current output terminal 220 to a desired value. Thus, each mirror circuit of the current mirror circuit 200 includes a DAC that allows the current output to be adjusted to match the current output of each other mirror circuit.

Figure 3:
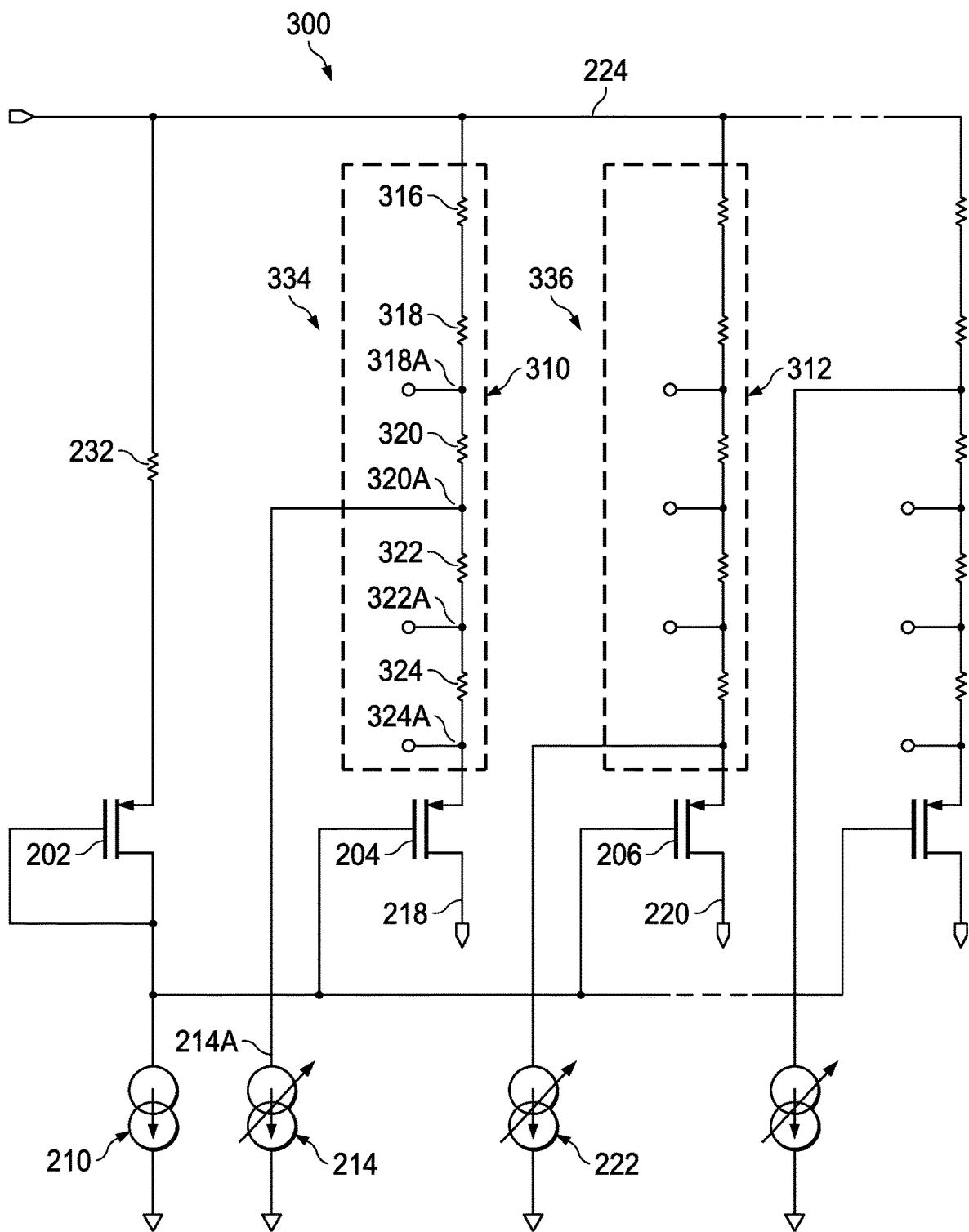
FIG. 3 shows a schematic diagram for a third current mirror circuit that includes a trim DAC in accordance with this description.

FIG. 3 shows a schematic diagram for a current mirror circuit 300 that includes a trim DAC in accordance with this description. The current mirror circuit 300 is similar to the current mirror circuit 200 and replaces the degeneration resistor in each mirror circuit with multiple resistors coupled in series. The current mirror circuit 300 includes the reference current circuit 232, a mirror circuit 334, and a mirror circuit 336. In practice, the current mirror circuit 300 includes one or more mirror circuits.

The mirror circuit 334 includes the current output terminal 218, the transistor 204, a plurality of resistors 310 coupled in series, and the DAC 214. The current output terminal 218 is coupled to a drain terminal 204D of the transistor 204 for providing an output current to circuitry external to the current mirror circuit 300. A source terminal 204S of the transistor 204 is coupled to the power rail 224 via the resistors 310. A gate terminal 204G of the transistor 204 is coupled to the 202G of the transistor 202.

The resistors 310 include resistors 316-324 coupled in series. Various implementations of the resistors 310 include two or more resistors coupled in series. The terminals of the resistors 310 provide connection points for coupling the DAC 214 to the resistors 310. In FIG. 3, the terminals 318A, 320A, 322A, are 324A illustrated, and the output terminal 214A of the DAC 214 is coupled to the terminal 320A. The current mirror circuit 300 includes switches, fusible links, or other electrical connection devices that allows the output terminal 214A to be selectably coupled to any of the terminals 318A, 320A, 322A, are 324A as needed. For example, while measuring the current provided at the current output terminal 218, a digital value provided to the DAC 214 is changed and one of the terminals 318A-324A is selected to couple the output terminal 214A to the source terminal 204S of the transistor 204, thereby adjusting the current flowing into the source terminal 204S of the transistor 204 and setting the current provided at the current output terminal 218 to a desired value.

The mirror circuit 336 includes a current output terminal 220, a transistor 206, a plurality of resistors 310 coupled in series, and the DAC 312. Structure and functionality of the mirror circuit 336 are as described with respect to the mirror circuit 334.

Figure 4:
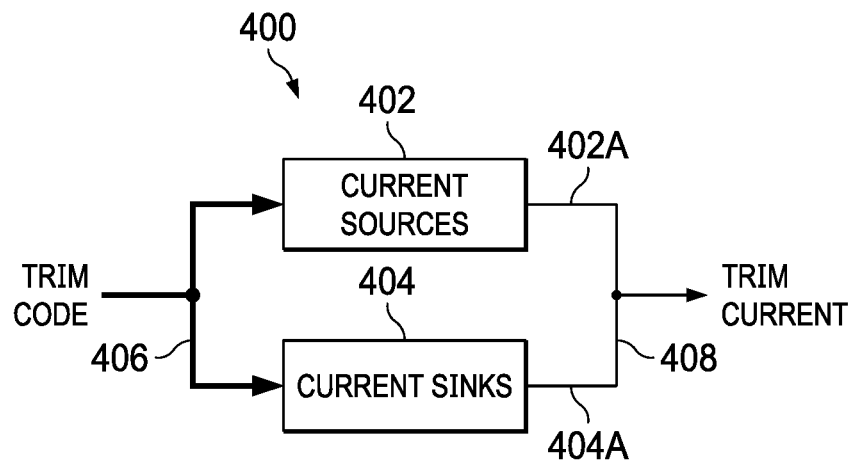
FIG. 4 shows a block diagram for an example DAC suitable for use as a trim DAC in current mirror circuits in accordance with this description.

FIG. 4 shows a block diagram for an example DAC 400 suitable for use in multi-output current mirror circuits in accordance with this description. The DAC 400 includes current sources 402 and s. The current sources 402 includes a plurality of selectably enablable current source circuit, and the current sinks 404 includes a plurality of selectably enablable current sink circuits. For example, each current source circuit of the current sources 402 includes a switch that couples a power rail to an output 402A of the current sources 402 based on the state of one or more bits of the TRIMCODE 406, where closure of the switch causes the current sources 402 to source a predetermined amount of current. Similarly, each current sink circuit of the current sinks 404 includes a switch that couples a ground rail to an output 404A of the current sinks 404 based on the state of one or more bits of the TRIMCODE 406, where closure of the switch causes the current sinks 404 to sink a predetermined amount of current. The current sources 402 and the current sinks 404 may be selectably enabled by a value of the TRIMCODE. For example, if a given bit of the TRIMCODE is active, then the current sources 402 are enabled and the current sinks 404 are disabled. Similarly, if the given bit is inactive, then the current sinks 404 are enabled and the current sources 402 are disabled. TRIM CURRENT 408 is provided to a mirror circuit (e.g., mirror circuits 134, 136, 234, 236, 334, or 336) to adjust output current.

Figure 5:
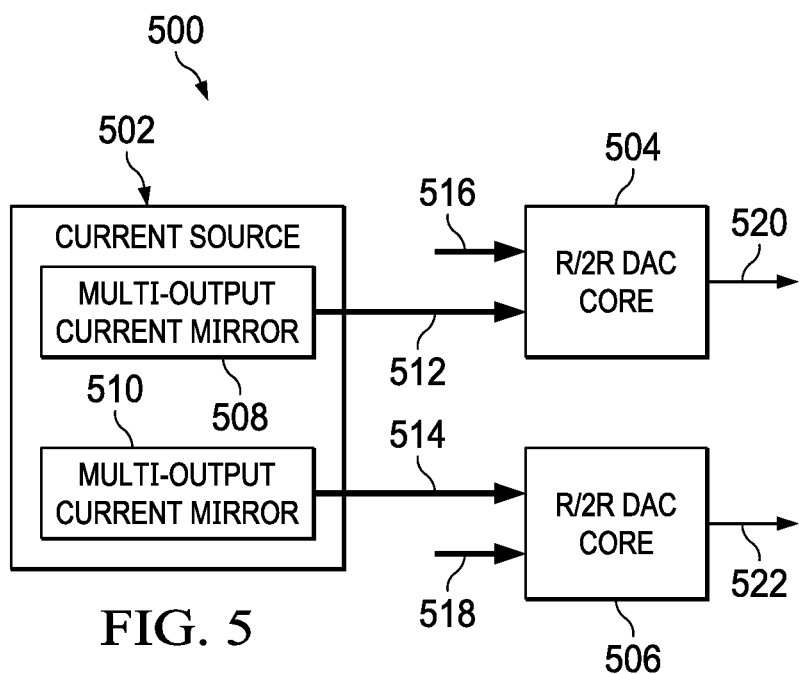
FIG. 5 shows a block diagram for an example multiple DAC circuit that includes a multi-output current mirror circuit in accordance with this description.

FIG. 5 shows a block diagram for an example multiple DAC circuit 500 that includes a multi-output current mirror circuit in accordance with this description. The multiple DAC circuit 500 includes a current source circuit 502, an R/2R DAC core 504, and an R/2R DAC core 506. The current source circuit 502 includes a multi-output current mirror circuit 508 and a multi-output current mirror circuit 510. The multi-output current mirror circuit 508 and the multi-output current mirror circuit 510 are implementations of the current mirror circuit 100, the current mirror circuit 200, or the current mirror circuit 300. The R/2R DAC core 504 includes an R/2R ladder, switches and other components for generating an output voltage 520 based on a digital input value 516. Similarly, the R/2R DAC core 506 includes an R/2R ladder, switches and other components for generating an output voltage 522 based on a digital input value 518. The multi-output current mirror circuit 508 provides multiple matched currents 512 to the R/2R DAC core 504, and the multi-output current mirror circuit 510 provides multiple matched currents 514 to the R/2R DAC core 506.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A current mirror circuit, comprising:
a current output terminal;
a first transistor comprising:
a first terminal coupled to a power rail;
a second terminal coupled to a current source; and
a third terminal coupled to the current source;
a second transistor comprising:
a first terminal coupled to the power rail;
a second terminal coupled to the second terminal of the first transistor; and
a third terminal coupled to the current output terminal; and
a digital-to-analog converter (DAC) comprising:
an output terminal coupled to the second transistor:
wherein:
the DAC is a first DAC;
the current output terminal is a first current output terminal; and
the current mirror circuit further comprises:
a second current output terminal;
a third transistor comprising:
a first terminal coupled to the power rail;
a second terminal coupled to the second terminal of the first transistor; and
a third terminal coupled to the second current output terminal; and
a second DAC comprising:
an output terminal coupled to the third transistor.

2. The current mirror circuit of claim 1, wherein the output terminal of the first DAC is coupled to the second terminal of the second transistor.

3. The current mirror circuit of claim 1, wherein the output terminal of the DAC is coupled to the first terminal of the second transistor.

4. The current mirror circuit of claim 1, further comprising a plurality of resistors coupled in series between the power rail and the first terminal of the second transistor.

5. The current mirror circuit of claim 4, wherein the output terminal of the DAC is coupled to a terminal of at least one of the resistors.

6. The current mirror circuit of claim 1, wherein the first DAC is configured to selectably source or sink current.

7. The current mirror circuit of claim 1, wherein the output terminal of the second DAC is coupled to the second terminal of the third transistor.

8. The current mirror circuit of claim 1, wherein the second DAC is configured to selectably source or sink current.

9. The current mirror circuit of claim 1, wherein the first terminal of the first transistor is coupled to the power rail through a first resistor.

10. The current mirror circuit of claim 1, wherein the first terminal of the second transistor is coupled to the power rail through a second resistor.

11. The current mirror circuit of claim 1, wherein the first terminal of the third transistor is coupled to the power rail through a third resistor.

12. The current mirror circuit of claim 1, wherein the current source is a fourth resistor.

13. The current mirror circuit of claim 1, wherein the second terminal of the first transistor is coupled to an output of an amplifier and the current source is coupled to a first input of the amplifier.

14. The current mirror circuit of claim 13, wherein a second input of an amplifier is coupled to voltage source.

15. The current mirror circuit of claim 1, wherein the second terminal of the first transistor is coupled to a first terminal of a fifth resistor and the second terminal of the second transistor is coupled to a second terminal of the fifth resistor.

16. The current mirror circuit of claim 1, wherein the second terminal of the first transistor is coupled to a first terminal of a sixth resistor and the second terminal of the third transistor is coupled to a second terminal of the sixth resistor.

* * * * *